United States Patent
Arena

(10) Patent No.: US 8,836,081 B2
(45) Date of Patent: Sep. 16, 2014

(54) SEMICONDUCTOR STRUCTURES, DEVICES AND ENGINEERED SUBSTRATES INCLUDING LAYERS OF SEMICONDUCTOR MATERIAL HAVING REDUCED LATTICE STRAIN

(75) Inventor: Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/592,049

(22) Filed: Aug. 22, 2012

(65) Prior Publication Data

US 2012/0319128 A1    Dec. 20, 2012

Related U.S. Application Data

(62) Division of application No. 12/576,116, filed on Oct. 8, 2009, now Pat. No. 8,278,193.

(60) Provisional application No. 61/109,784, filed on Oct. 30, 2008.

(51) Int. Cl.
*H01L 29/12*    (2006.01)
*H01L 21/02*    (2006.01)
*H01L 21/762*    (2006.01)

(52) U.S. Cl.
CPC ...... *H01L 21/0254* (2013.01); *H01L 21/02647* (2013.01); *H01L 21/76254* (2013.01); *H01L 21/02458* (2013.01); *H01L 21/0242* (2013.01)
USPC ........... 257/613; 257/615; 257/189; 257/190; 257/E29.089

(58) Field of Classification Search
USPC ................. 257/613, 615, 189, 190, E29.089
See application file for complete search history.

(56) References Cited

U.S. PATENT DOCUMENTS

| | | |
|---|---|---|
| 5,374,564 A | 12/1994 | Bruel |
| 5,391,257 A | 2/1995 | Sullivan et al. |
| 5,395,769 A | 3/1995 | Arienzo et al. |
| 5,401,544 A | 3/1995 | Nakahata et al. |
| 5,446,330 A | 8/1995 | Eda et al. |

(Continued)

FOREIGN PATENT DOCUMENTS

| | | |
|---|---|---|
| EP | 1052684 A1 | 11/2000 |
| EP | 1246233 A2 | 10/2002 |

(Continued)

OTHER PUBLICATIONS

Chen et al, A Systematic Study on Group III-Nitride Thin Films with Low Temperature Deposited via MOCVD, Optical Materials, vol. 26 (2004), pp. 417-420.

(Continued)

*Primary Examiner* — Julia Slutsker
(74) *Attorney, Agent, or Firm* — TraskBritt

(57) ABSTRACT

Methods of fabricating semiconductor devices or structures include forming structures of a semiconductor material overlying a layer of a compliant material, subsequently changing the viscosity of the compliant material to relax the semiconductor material structures, and utilizing the relaxed semiconductor material structures as a seed layer in forming a continuous layer of relaxed semiconductor material. In some embodiments, the layer of semiconductor material may comprise a III-V type semiconductor material, such as, for example, indium gallium nitride. Novel intermediate structures are formed during such methods. Engineered substrates include a continuous layer of semiconductor material having a relaxed lattice structure.

13 Claims, 7 Drawing Sheets

(56) References Cited

U.S. PATENT DOCUMENTS

| | | | |
|---|---|---|---|
| 5,448,126 A | 9/1995 | Eda et al. |
| 5,630,949 A | 5/1997 | Lakin |
| 5,714,395 A | 2/1998 | Bruel |
| 5,877,070 A | 3/1999 | Goesele et al. |
| 5,882,987 A | 3/1999 | Srikrishnan |
| 5,966,620 A | 10/1999 | Sakaguchi et al. |
| 5,994,207 A | 11/1999 | Henley et al. |
| 6,010,579 A | 1/2000 | Henley et al. |
| 6,020,252 A | 2/2000 | Aspar et al. |
| 6,054,370 A | 4/2000 | Doyle |
| 6,103,597 A | 8/2000 | Aspar et al. |
| 6,107,113 A | 8/2000 | Harmand et al. |
| 6,133,058 A | 10/2000 | Kidoguchi et al. |
| 6,303,468 B1 | 10/2001 | Aspar |
| 6,328,796 B1 | 12/2001 | Kub et al. |
| 6,335,258 B1 | 1/2002 | Aspar et al. |
| 6,562,127 B1 | 5/2003 | Kud et al. |
| 6,744,064 B2 | 6/2004 | Lee et al. |
| 6,756,286 B1 | 6/2004 | Moriceau et al. |
| 6,809,044 B1 | 10/2004 | Aspar et al. |
| 6,873,012 B2 | 3/2005 | Stecher et al. |
| 6,946,365 B2 | 9/2005 | Aspar |
| RE39,484 E | 2/2007 | Bruel |
| 7,273,798 B2 | 9/2007 | Lester et al. |
| 7,879,732 B2 | 2/2011 | Hu et al. |
| 8,039,869 B2 | 10/2011 | Lester et al. |
| 8,067,298 B2 | 11/2011 | Kononchuk |
| 2002/0068201 A1 | 6/2002 | Vaudo et al. |
| 2002/0078881 A1* | 6/2002 | Cuomo et al. ............. 117/84 |
| 2002/0197825 A1 | 12/2002 | Usui et al. |
| 2003/0102473 A1* | 6/2003 | Chason et al. ............. 257/43 |
| 2004/0048448 A1 | 3/2004 | Koike et al. |
| 2004/0192067 A1 | 9/2004 | Ghyselen et al. |
| 2004/0195656 A1* | 10/2004 | Ghyselen et al. .......... 257/616 |
| 2004/0209402 A1 | 10/2004 | Chai et al. |
| 2004/0241902 A1 | 12/2004 | Letertre et al. |
| 2005/0003641 A1 | 1/2005 | Faure |
| 2005/0161772 A1 | 7/2005 | Suzuki |
| 2006/0046325 A1 | 3/2006 | Usui et al. |
| 2007/0072324 A1 | 3/2007 | Krames et al. |
| 2007/0087525 A1* | 4/2007 | Chen et al. ............. 438/429 |
| 2008/0211061 A1 | 9/2008 | Atwater, Jr. et al. |
| 2008/0230802 A1 | 9/2008 | Bakkers et al. |
| 2010/0087049 A1 | 4/2010 | Kononchuk |
| 2010/0109126 A1 | 5/2010 | Arena |
| 2010/0176490 A1* | 7/2010 | Letertre et al. ............. 257/615 |
| 2012/0161289 A1 | 6/2012 | Werkhoven |

FOREIGN PATENT DOCUMENTS

| | | |
|---|---|---|
| EP | 1278233 A1 | 1/2003 |
| EP | 1385215 A2 | 1/2004 |
| EP | 1750311 A2 | 2/2007 |
| GB | 2354370 A | 3/2001 |
| WO | 0068473 A1 | 11/2000 |
| WO | 2005004212 A1 | 1/2005 |

OTHER PUBLICATIONS

Christensen, A General Measure for the Ductility of Materials, Journal of Materials Science Letters, vol. 18 (1999) pp. 1371-1373.

Feng et al., Stress Generation and Relaxation During Film Heteroepitaxy on a Compliant Substrate with a Viscoelastice Glass Interlayer, Mat. Res. Soc. Symp. Proc. vol. 696, 2002, Materials Research Society, pp. N3.19.3-N3.19.6.

French et al., Reflow of BPSG for Sensor Applications, J. Micromech. Microeng., Vo. 3 (1993), pp. 135-137.

Hansen et al., Development of a Glass-Bonded Compliant Substrate, Journal of Crystal Growth, vol. 195 (1998) pp. 144-150.

Hobart et al., Compliant Substrates: A Comparative Study of the Relaxation Mechanisms of Strained Films Bonded to High and Low Viscosity Oxides, Journal of Electronic Materials,vol. 29, No. 7, pp. 897-900, (2000).

International Preliminary Report on Patentability for PCT/US2009/059939, dated May 3, 2011.

International Search Report for International Application No. PCT/US2009/059939 mailed Feb. 22, 2010, 4 pages.

International Written Opinion for International Application No. PCT/US2009/059939, mailed Feb. 22, 2010, 8 pages.

Kraus et al., Growth and Characterization of InGaN by RF-MBE, Journal of Crystal Growth, vol. 323 (2011) pp. 72-75.

Moran et al., Kinetics of Strain Relaxation in Semiconductor Films Grown on Borosilicate Glass-Bonded Substrates, Journal of Electronic Materials, vol. 30, No. 7, 2001, pp. 802-806.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638-2640.

Singapore Search Report for Singapore Application No. 2009051467 dated Sep. 9, 2010, 7 pages.

Syms et al., Optimization of Borophosphosilicate Glass Compositions for Silica-on-Silicon Integrated Optical Circuits Fabricated by the Sol-Gel Process, Electronics Letters, vol. 32, No. 13, Jun. 20, 1996, pp. 1233-1234.

Yin et al., Buckling Suppression of SiGe Islands on Compliant Substrates, Journal of Applied Physics, Nov. 15, 2003, vol. 94, No. 10, pp. 6875-6882.

Yin et al., Relaxed SiGe Layers with High Ge Content by Compliant Substrates, Integration of Heterogeneous Thin-Film Materials and Devices Symposium, Mater. Res. Soc. Symposium Proceedings vol. 768, 2003, 6 pages.

Yin et al., Strain Relaxation of SiGe Islands on Compliant Oxide, Journal of Applied Physics, Jun. 15, 2003, vol. 91, No. 12, pp. 9716-9722.

Zheleva et al., Dislocation Density Reduction Via Lateral Epitaxy in Selectively Grown GaN Structures, Appl. Phys. Lett., vol. 71, No. 17, Oct. 27, 1997, pp. 2472-2474.

Zheng et al., Temperature Dependence of the Material Characterizing Ductility Factor in the New Damage Theory, International Journal of Fracture, vol. 76, 1996, pp. R77-R81.

* cited by examiner

SEMICONDUCTOR STRUCTURES, DEVICES AND ENGINEERED SUBSTRATES INCLUDING LAYERS OF SEMICONDUCTOR MATERIAL HAVING REDUCED LATTICE STRAIN

CROSS-REFERENCE TO RELATED APPLICATIONS

This application is a divisional of U.S. patent application Ser. No. 12/576,116, filed Oct. 8, 2009, now U.S. Pat. No. 8,278,193, issued Oct. 2, 2012, which claims the benefit under 35 U.S.C. §119(e) of U.S. Provisional Application No. 61/109,784, filed Oct. 30, 2008, which is incorporated herein by reference. The subject matter of this application is also related to the subject matter of U.S. patent application Ser. No. 12/563,953, filed Sep. 21, 2009, now U.S. Pat. No. 8,486,771, issued Jul. 16, 2013, and titled "Methods of Forming Relaxed Layers of Semiconductor Materials, Semiconductor Structures, Devices and Engineered Substrates Including Same," U.S. patent application Ser. No. 12/977,999, filed Dec. 23, 2010, now U.S. Pat. No. 8,637,383, issued Jan. 28, 2014, and titled "Strain Relaxation Using Metal Materials and Related Structures," and U.S. patent application Ser. No. 12/574,142, filed Oct. 6, 2009, now U.S. Pat. No. 8,067,298, issued Nov. 29, 2011, and titled "Relaxation of a Strained Material Layer With Application of a Stiffener." This application is also related to U.S. patent application Ser. No. 14/319,029, filed Jun. 30, 2014, and the subject matter of this application is related to the subject matter of U.S. patent application Ser. No. 14/165,471, filed Jan. 27, 2014.

FIELD

The present invention generally relates to the fabrication of semiconductor structures or devices using engineered substrates, to intermediate structures formed during the fabrication of semiconductor structures or devices, and to engineered substrates for use in the fabrication of semiconductor structures or devices.

BACKGROUND

Substrates that include one or more layers of semiconductor material are used to form a wide variety of semiconductor structures and devices including, for example, integrated circuit (IC) devices (e.g., logic processors and memory devices), radiation-emitting devices (e.g., light-emitting diodes (LEDs), resonant cavity light-emitting diodes (RCLEDs), vertical cavity surface emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in.) or more). Although silicon wafers generally have thicknesses of several hundred microns (e.g., about 700 microns) or more, only a very thin layer (e.g., less than about three hundred nanometers (300 nm) of the semiconductor material on a major surface of the silicon wafer is actually used to form active devices on the silicon wafer.

It has been discovered that the speed and power efficiency of semiconductor devices can be improved by electrically insulating the portion of the semiconductor material on a semiconductor substrate that is actually used to form the semiconductor devices from the remaining bulk semiconductor material of the substrate. As a result, so-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively larger host or base substrate to facilitate handling of the overall engineered substrate by manufacturing equipment. As a result, the base substrate is often referred to in the art as a "handle" or "handling" substrate. The base substrate may also comprise a semiconductor material.

A wide variety of engineered substrates are known in the art and may include semiconductor materials such as, for example, silicon (Si), germanium (Ge), III-V type semiconductor materials, and II-VI type semiconductor materials.

For example, an engineered substrate may include an epitaxial layer of III-V type semiconductor material formed on a surface of a base substrate, such as, for example aluminum oxide ($Al_2O_3$) (which may be referred to as "sapphire"). Using such an engineered substrate, additional layers of material may be formed and processed (e.g., patterned) over the epitaxial layer of III-V type semiconductor material to form one or more devices on the engineered substrate.

Due to a natural tendency of atoms of different material layers to align with one another when one crystal is formed on another crystal, when a layer of semiconductor material is formed (e.g., epitaxially grown) over another layer of material (e.g., an underlying layer of a different semiconductor material), the crystal tends to stretch/compress or "strain" to align with the atoms in the underlying material. The formation and use of strained layers of semiconductor material is difficult because these strained layers may develop defects, such as dislocations, due to mismatch of the lattice parameters between adjacent materials. Depending on its particular composition, the layer of semiconductor material may be only grown to a particular thickness, often referred to as a "critical thickness," before defects and separation of compositional phases begin to develop. The critical thickness of a material is dependent on the lattice structure of the underlying material, the composition of the semiconductor material, and the growth conditions under which the layer of semiconductor material is formed. Dislocations may form above a critical thickness when a lattice parameter mismatch exists between the layer of semiconductor material and the underlying substrate material. When forming these layers epitaxially, both a high doping concentration and increased material thickness are desirable to reduce electrical resistivity. However, as the concentration of dopant and the thickness of the layer of semiconductor material is increased, preserving a crystal structure having low-defect density becomes increasingly difficult.

For example, indium gallium nitride ($In_xGa_{1-x}N$) devices may be formed on an engineered substrate by growing one or more epitaxial device layers each comprising indium gallium nitride ($In_xGa_{1-x}N$) (which together form a "device structure stack") on a seed layer of gallium nitride formed on the engineered substrate. Any mismatch in the crystal lattices of the adjacent layers of indium gallium nitride may induce strain in the crystal lattice of one or more of the indium gallium nitride device layers, which may effectively limit the thickness of the indium gallium nitride device layer and/or the concentration of indium in the indium gallium nitride device layer. Lattice strain is more problematic in indium gallium nitride device layers having higher indium content and increased thicknesses. The presence of such lattice strain in a layer of semiconductor material may be undesirable for a number of reasons. For example, the presence of lattice strain in a layer of semiconductor material may result in an increased density of defects (e.g., lattice dislocations) in the layer of semiconductor material, undesirable morphology at the surface of the layer of semiconductor material, and may even result in the formation of cracks in the layer of semiconductor material. Furthermore, the presence of lattice strain in a layer of semiconductor material may facilitate the onset of undesirable separation of material phases within the layer of semiconductor material. Unfortunately, currently available substrate materials lattice matched to indium gallium nitride are impractical for high quality materials deposition purposes.

It is difficult to form an indium gallium nitride seed layer on the surface of an engineered substrate in such a manner that the indium gallium nitride seed layer has a lattice parameter that will match that of an indium gallium nitride device layer to be formed thereover. As a result, the crystal lattice of the overlying device layer of indium gallium nitride will be strained upon formation thereof when using the underlying seed layer of indium gallium nitride.

Hobart et al., "Compliant Substrates: A Comparative Study of the Relaxation Mechanisms of Strained Films Bonded to High and Low Viscosity Oxides," Journal of Electronic Materials, 29(7):897-900 (2000), discloses a method of fabricating a compliant substrate by transferring SiGe islands to a viscous borophosphosilicate glass (BPSG) compliant film. As shown in FIG. 1A, a compressively strained heteroepitaxial $Si_{0.7}Ge_{0.3}$ film 106 bonded to high and low viscosity glass compliant layers were formed by transferring the $Si_{0.7}Ge_{0.3}$ film to silicon substrates 102 covered with borophosphosilicate glass 104. At temperatures of near 800° C., relaxation and buckling were observed in the $Si_{0.7}Ge_{0.3}$ film 106 overlying the borophosphosilicate glass 104.

Yin et al., "Strain Relaxation of SiGe Islands on Compliant Oxide," J. App. Physics, 91(12):9716-9722 (2002), disclose a method of forming an epitaxial $Si_{0.7}Ge_{0.3}$ film by transferring the epitaxial $Si_{0.7}Ge_{0.3}$ film to borophosphosilicate glass by a wafer-bonding technique. Referring to FIG. 1B, after transferring the epitaxial $Si_{0.7}Ge_{0.3}$ film, the $Si_{0.7}Ge_{0.3}$ film is patterned into arrays of square islands 114. The $Si_{0.7}Ge_{0.3}$ islands 114 on the borophosphosilicate glass 104 are annealed, resulting in lateral expansion and relaxation 118.

In view of the above, there is a need for methods that can be used to reduce lattice parameter mismatch between adjacent layers, and the resulting lattice strain therein, in semiconductor structures and devices such as, for example, engineered substrates, integrated circuit (IC) devices, radiation-emitting devices, and radiation sensor devices.

BRIEF SUMMARY

In some embodiments, the present invention includes methods of fabricating semiconductor structures or devices. The methods may include forming a plurality of openings extending through a layer of semiconductor material and at least partially through a layer of compliant material and reflowing the layer of compliant material to relax the remaining portions of the layer of semiconductor material. The methods may further include growing another semiconductor material over the remaining portions of the layer of semiconductor material, removing a portion of the layer of compliant material selective to the another semiconductor material and reflowing the layer of compliant material. For example, the another semiconductor material may be grown while simultaneously reflowing the layer of compliant material.

The present invention includes additional embodiments of methods of fabricating semiconductor structures or devices. A portion of each of a layer of semiconductor material and a layer of compliant material overlying a substrate may be removed to form a plurality of openings. Thereafter, a layer of compliant material may be heated to alter a viscosity thereof causing the remaining portions of the layer of semiconductor material to relax. Another semiconductor material may be grown over the remaining portions of the layer of semiconductor material and another portion of the layer of compliant material between each of the remaining portions of the layer of semiconductor material may be removed. After removing the another portion of the layer of compliant material, the layer of compliant material may be reflowed to cause the remaining portions of the layer of semiconductor material to further relax and to cause the another semiconductor material to relax. A semiconductor material may be substantially laterally grown within each of the openings until a continuous layer of relaxed (or partially relaxed) semiconductor material is formed. Thereafter, vertical growth of the semiconductor material may be performed to achieve the desired thickness.

In yet further embodiments, the present invention includes methods of forming engineered substrates. For example, an epitaxial layer of indium gallium nitride may be grown or otherwise formed on a substrate that includes a layer of glass material. A portion of the layer of indium gallium nitride and a portion of the layer of glass material may be removed to form a plurality of openings extending partially through the layer of glass material. The layer of glass material may be heated to a temperature sufficient to decrease a viscosity thereof.

Additional embodiments of the present invention include intermediate structures formed during methods of fabricating semiconductor structures or devices as described herein. The intermediate structures may include a plurality of openings extending through a III-V type semiconductor material and partially into a layer of glass material overlying a base substrate. The layer of glass material may exhibit a changeable viscosity sufficient to provide redistribution thereof. The intermediate structure may further include a sacrificial material disposed between the layer of glass material and the III-V type semiconductor material. The III-V type semiconductor material may be planar with, or may be formed over the sacrificial material.

Embodiments of the present invention also include engineered substrates. The engineered substrates may include a layer of semiconductor material disposed on a layer of compliant material overlying a substrate, wherein the layer of semiconductor material exhibits a relaxed (or partially relaxed) lattice structure. The engineered substrate may further include a sacrificial material disposed in each of the openings.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION

Figure 1A:
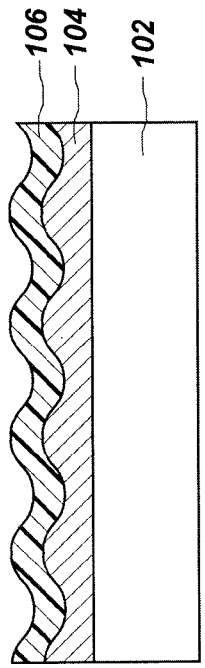
FIGS. 1A and 1B are cross-sectional views of an intermediate structure formed by methods known in the art that include a layer of semiconductor material.
Figure 1A:
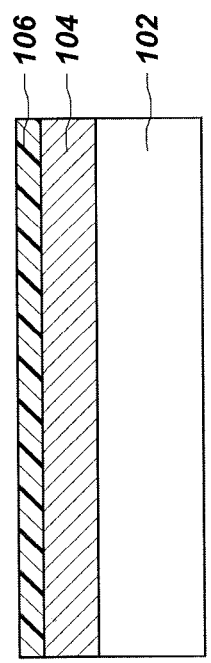
Figure 1B:
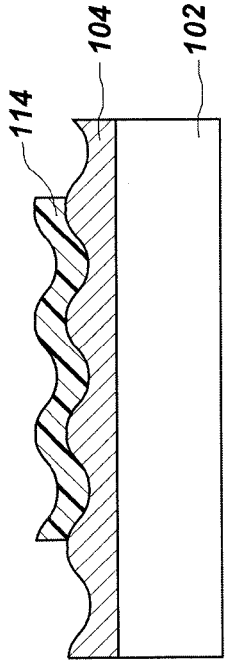
Figure 1B:
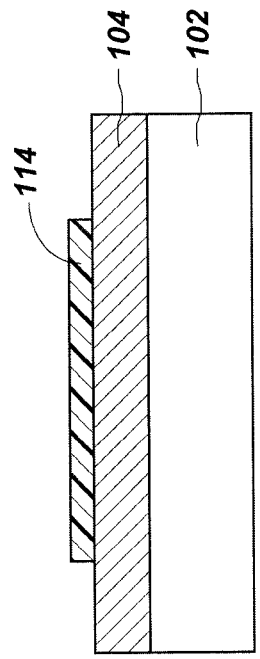

The illustrations presented herein are not meant to be actual views of any particular material, apparatus, system, or method, but are merely idealized representations that are employed to describe the present invention. Additionally, elements common between figures may retain the same numerical designation.

As used herein, the term "III-V type semiconductor material" means and includes any material predominantly comprised of one or more elements from group IIIA of the periodic table (B, Al, Ga, In, and Tl) and one or more elements from group VA of the periodic table (N, P, As, Sb, and Bi).

As used herein, the term "II-VI type semiconductor material" means and includes any material predominantly comprised of one or more elements from group IIB of the periodic table (Zn, Cd, and Hg) and one or more elements from group VIA of the periodic table (O, S, Se, Te, and Po).

As used herein, the term "critical thickness," when used with respect to a material, means the maximum thickness above which the formation of defects, such as dislocations, within the material becomes energetically favorable.

As used herein, the term "engineered substrate," in its broadest sense, means and includes any substrate comprising two or more layers of material and that is intended to be used as a substrate for the fabrication of one or more semiconductor device thereon. Engineered substrates include, for example, semiconductor-on-insulator type substrates.

As used herein, the term "epitaxial layer of material," means a layer of material that is at least substantially a single crystal of the material and that has been formed such that the single crystal exhibits a known crystallographic orientation.

As used herein, the term "growth lattice parameter," when used with respect to an epitaxial layer of semiconductor material, means an average lattice parameter exhibited by the layer of semiconductor material as the layer of semiconductor material is epitaxially grown at an elevated temperature.

As used herein, the term "lattice strain," when used with respect to a layer of material, means strain of the crystal lattice in directions at least substantially parallel to the plane of the layer of material and may be compressive strain or tensile strain. Similarly, the term "average lattice parameter," when used with respect to a layer of material, means the average lattice parameters in dimensions at least substantially parallel to the plane of the layer of material.

Similarly, the term "strained" is used to indicate that the crystal lattice has been deformed (e.g., stretched or compressed) from the normal spacing for such material so that its lattice spacing is different than what would normally be encountered for such material in a homogeneous relaxed crystal.

As used herein, the term "lattice constant" means and includes the distance between atoms of a unit cell measured in the plane of the surface.

Each of the terms "relax" or "relaxed" as used herein means and includes any layer of semiconductor material which has an unstained crystallographic structure comprising asymmetric units (such as atoms or molecules) oriented in an energetically favorable manner. The term "relaxing" means and includes changing the position of atoms in a material layer relative to the bulk positions so that the lattice strain within the material is at least partially relieved and the material nears or reaches its equilibrium lattice constant.

As used herein, the term "reflow" means and includes heating or otherwise treating a material such that it is softened or has a decreased viscosity so that it may redistribute itself under the action of its own weight.

Embodiments of the present invention include methods and structures that facilitate the fabrication of layers of semiconductor material (such as, for example, epitaxial layers of III-V type semiconductor materials on engineered substrates) that have controlled and/or selected degrees of lattice strain and controlled and/or selected average lattice parameters. Example embodiments of methods of fabricating semiconductor structures or devices that include such layers of semiconductor material are described below with reference to FIGS. 2A through 5D.

Figure 2A:
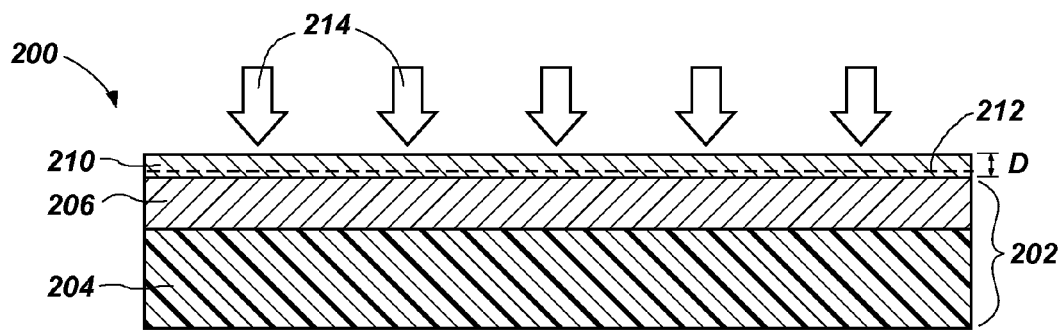
FIGS. 2A-2G are simplified cross-sectional views of an intermediate structure that may be formed during embodiments of methods of the present invention.

Referring to FIG. 2A, a first intermediate structure 200 may be fabricated that includes a layer of semiconductor material 210 attached to a sacrificial substrate 202. The sacrificial substrate 202 may comprise a homogeneous or heterogeneous composite material such as, for example, sapphire. The layer of semiconductor material 210 comprises the layer in which it is desired to reduce the level of compressive and/or tensile strain, and that may ultimately be used as, for example, a seed layer for forming one or more additional layers of semiconductor material thereon as part of the fabrication of an active semiconductor device.

In some embodiments, the layer of semiconductor material 210 may comprise a single epitaxial layer, or multiple epitaxial layers of a semiconductor material. Furthermore, in some embodiments, the layer of semiconductor material 210 may comprise an epitaxial layer of III-V type semiconductor material. By way of non-limiting example, the layer of semiconductor material 210 may comprise at least one of an epitaxial layer of gallium nitride (GaN), an epitaxial layer of indium gallium nitride ($In_xGa_{1-x}N$) and an epitaxial layer of aluminum gallium nitride ($Al_xGa_{1-x}N$).

As shown in FIG. 2A, the sacrificial substrate 202 may include a base material 204 and, optionally, an intermediate layer of semiconductor material 206, that is ultimately disposed between the layer of semiconductor material 210 and the base material 204. The intermediate layer of semiconductor material 206 may include a single layer of semiconductor material or multiple layers of semiconductor material and may be used, for example, as a seed layer for forming the layer of semiconductor material 210 thereon when it is difficult or impossible to form the layer of semiconductor material 210 directly on the base material 204 of the sacrificial substrate 202. The figures are not shown to scale, and, in actuality, the intermediate layer of semiconductor material 206 and the layer of semiconductor material 210 may be relatively thin in relation to a thickness of the base material 204 of the sacrificial substrate 202.

By way of example and not limitation, the intermediate structure 200 may comprise a single intermediate layer of semiconductor material 206 formed on the base material 204 of the sacrificial substrate 202, and the layer of semiconductor material 210 may be formed on the intermediate layer of semiconductor material 206. As one particular non-limiting example, the intermediate layer of semiconductor material 206 may comprise a single epitaxial layer of gallium nitride (GaN), and the layer of semiconductor material 210 may comprise an epitaxial layer of indium gallium nitride ($In_x Ga_{1-x}N$).

To form the intermediate structure 200 shown in FIG. 2A, the intermediate layer of semiconductor material 206 may be epitaxially grown or otherwise formed over a major surface of the base material 204, after which the layer of semiconductor material 210 may be epitaxially grown or otherwise formed over the intermediate layer of semiconductor material 206. In additional embodiments, the layer of semiconductor material 210 may, optionally, be formed directly on the base material 204 without including the intermediate layer of semiconductor material 206.

In some embodiments, the intermediate layer of semiconductor material 206 may include one or more layers of semiconductor material such as, for example, a III-V type semiconductor material and may be formed to have a thickness sufficient for epitaxial growth of additional layers of semiconductor material thereon. By way of non-limiting example, the intermediate layer of semiconductor material 206 (which may comprise, for example, a layer of gallium nitride), may be formed to a thickness of between about 0.01 μm to about 100 μm, may be doped or undoped, and may be polar, semipolar or nonpolar. The intermediate layer of semiconductor material 206 may be grown using various methods known in the art such as, for example, hydride vapor phase epitaxy (HVPE), metalorganic vapor phase epitaxy (MOVPE), and molecular beam epitaxy (MBE). Additionally, various methods may be used in forming the intermediate layer of semiconductor material 206 to reduce the density of dislocations therein, such as, for example, epitaxial lateral over-growth (ELO), facet-initiated epitaxial lateral over-growth (FIELO), in-situ masking, and wafer bonding.

In additional embodiments, the intermediate layer of semiconductor material 206 may be bonded or attached to the sacrificial substrate 202 using techniques known in the art of integrated circuit fabrication, such as, for example, thermal bonding, thermal compression bonding or thermal ultrasonic bonding. As a non-limiting example, the intermediate layer of semiconductor material 206 and the base material 204 may be bonded together by abutting them against one another, and maintaining them at an elevated temperature (selected to impart a selected lattice parameter to the layer of semiconductor material 210) (e.g., at least above one hundred degrees Celsius (100° C.)) and pressure for a sufficient amount of time.

Referring still to FIG. 2A, the layer of semiconductor material 210 may be formed on the intermediate layer of the semiconductor material 206 using various methods known in the art. By way of non-limiting example, the layer of semiconductor material 210 may be a pseudomorphically strained indium gallium nitride layer formed to have a thickness less than a critical thickness thereof, such as, for example, between about 10 nm and about 100 nm. By forming the pseudomorphically strained indium gallium nitride layer, further relaxation through defect formation and phase separation may be further inhibited. The critical thickness of the layer of semiconductor material 210 may be determined based on variables such as, for example, chemical composition and growth conditions which are known in the art and not described in detail herein. The polarity of the layer of semiconductor material 210 may be converted to the polarity of the underlying material. For example, where the layer of semiconductor material 210 is formed over an intermediate layer of semiconductor material 206, the layer of semiconductor material 210 may inherit the polarity of the intermediate layer of semiconductor material 206. The layer of semiconductor material 210 may be formed over the intermediate layer of semiconductor material 206 using a conventional method such as metalorganic chemical vapor deposition (MOCVD).

Figure 2B:
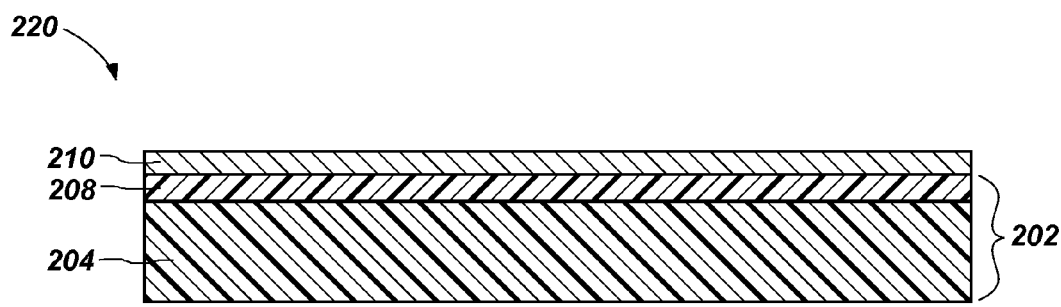

As shown in FIG. 2B, in some embodiments, the intermediate structure 200 may optionally include a layer of dielectric material 208 overlying the base material 204 of the sacrificial substrate 202, and the layer of semiconductor material 210 may be formed on the layer of dielectric material 208 to form the intermediate structure 220. The layer of dielectric material 208 may, optionally, be formed over a major surface of the base material 204. The layer of dielectric material 208 may include, for example, silicon oxynitride (SiON), silicon nitride ($Si_3N_4$), or silicon dioxide ($SiO_2$), and may be formed using, for example, chemical vapor deposition (CVD), physical vapor deposition (PVD), or atomic layer deposition (ALD). The layer of semiconductor material 210 may be transferred, for example, by bonding processes, or otherwise formed on the layer of dielectric material 208. The embodiment of FIG. 2B is particularly suited when material 210 is polar, and the final structure should exhibit a given final polarity.

In some embodiments, the layer of semiconductor material 210 may be grown or formed as m-plane or a-plane material, rather than as c-plane material. M-plane and a-plane III-nitride materials are nonpolar orientations without gallium or nitrogen faces.

Figure 2C:
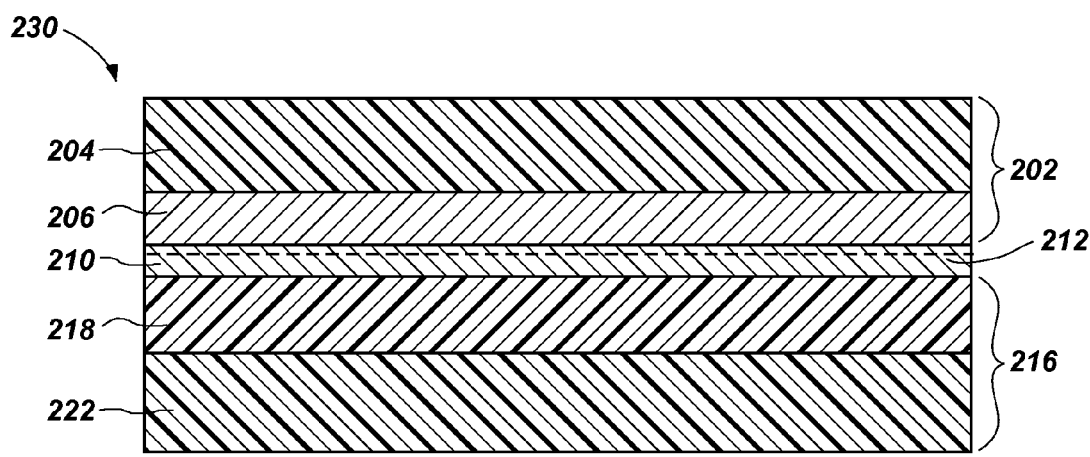

Referring to FIG. 2C, on a side opposite the sacrificial substrate 202, the layer of semiconductor material 210 may be bonded or attached to a bonding substrate 216 to form the intermediate structure 230. The bonding substrate 216 may comprise a support material 222 and a layer of compliant material 218 that is ultimately disposed between the support material 222 and the layer of semiconductor material 210. The support material 222 may comprise a homogeneous material or a heterogeneous (i.e., composite) material, which provides mechanical support for the overlying layer of compliant material 218. In some embodiments, the support material 222 may comprise a material having the same or substantially similar thermal characteristics as the base material 204. By way of non-limiting example, the support material 222 may comprise sapphire, silicon, III-arsenides, quartz ($SiO_2$), fused silica ($SiO_2$) glass, a glass-ceramic composite material (such as, for example, that sold by Schott North America, Inc. of Duryea, Pa. under the trademark ZERODUR®), or a fused silica glass composite material (such as, for example, $SiO_2$—$TiO_2$ or $Cu_2$—$Al_2O_3$—$SiO_2$).

The layer of compliant material 218 may be used to facilitate bonding of the bonding substrate 216 to the layer of semiconductor material 210 and may comprise, for example, a material having a glass transition temperature ($T_g$) of less than or equal to about a growth temperature of the layer of semiconductor material 210. By way of non-limiting example, the layer of compliant material 218 may comprise at least one of an oxide, a phosphosilicate glass (PSG), borosilicate glass (BSG), a borophosphosilicate glass (BPSG), a polyimide, a doped or undoped quasi-inorganic siloxane spin-on-glass (SOG), an inorganic spin-on-glass (i.e., methyl-, ethyl-, phenyl-, or butyl), and a doped or undoped silicate. By way of non-limiting example, the bonding substrate 216 and the layer of semiconductor material 210 may be bonded together by abutting them against one another, and maintaining them at an elevated temperature (selected to impart a selected lattice parameter to the layer of semiconductor material 210) (e.g., at least above one hundred degrees Celsius (100° C.)) and pressure for a sufficient amount of time.

In embodiments in which the layer of semiconductor material 210 comprises an epitaxial layer of indium gallium nitride ($In_xGa_{1-x}N$) and the intermediate layer of semiconductor material 206 comprises gallium nitride (GaN), the bonding substrate 216 may be bonded to the layer of indium gallium nitride at a temperature of, for example, about eight hundred degrees Celsius (800° C.) to cause the pseudomorphically strained layer of indium gallium nitride to be stretched such that its average lattice parameter is at least substantially equal to its unstrained average lattice parameter.

Figure 2D:
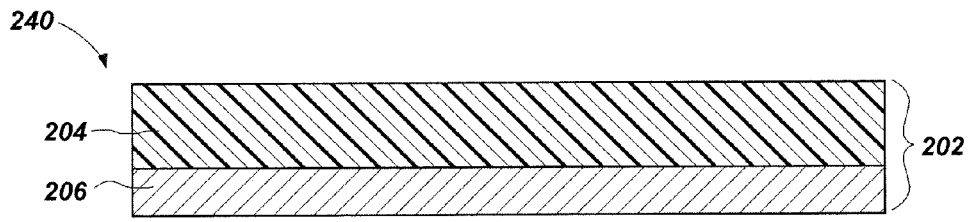

As shown in FIG. 2D, after bonding the layer of semiconductor material 210 to the bonding substrate 216, the layer of semiconductor material 210, together with the bonding substrate 216 may be separated from the sacrificial substrate 202 (or the sacrificial substrate 202 may be separated from the layer of semiconductor material 210). Optionally, the intermediate layer of semiconductor material 206, together with the layer of semiconductor material 210 and the bonding substrate 216, may be separated from the base material 204. Separation of the sacrificial substrate 202 from the intermediate layer of semiconductor material 206, or separation of the sacrificial substrate 202 from the layer of semiconductor material 210, may be performed by various chemical, thermal, or mechanical processes, such as, for example, by a grinding process, an etching process, a polishing process, or a laser lift-off process. The method may be performed to remove the entire layer of semiconductor material 210 from the sacrificial substrate 202, or only a portion thereof. In embodiments utilizing the sacrificial substrate 202 of FIG. 2B, layer of semiconductor material 210 can be separated or detached from base material 204 by elimination of base material 204 employing, for example, etching, grinding or laser irradiation through the base material 204 and detachment at the level of the dielectric material 208.

By way of example and not limitation, the process known in the industry as the SMART CUT® process may be used to separate the base material 204 and, optionally, the intermediate layer of semiconductor material 206, from the layer of semiconductor material 210. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entirety by this reference.

Referring again to FIG. 2A, a plurality of ions (e.g., hydrogen or inert gas ions) may be implanted into the intermediate structure 200. For example, ions may be implanted into the intermediate structure 200 from an ion source (not shown) positioned on a side of the intermediate structure 200 adjacent the layer of semiconductor material 210. As represented by the directional arrows 214 shown in FIG. 2A, ions may be implanted into the intermediate structure 200 along a direction substantially perpendicular to the layer of semiconductor material 210. As known in the art, the depth at which the ions are implanted into the intermediate structure 200 is at least partially a function of the energy with which the ions are implanted into the intermediate structure 200. Generally, ions implanted with less energy will be implanted at relatively shallower depths, while ions implanted with higher energy will be implanted at relatively deeper depths.

As a non-limiting example, ions may be implanted into the intermediate structure 200 with a predetermined energy selected to implant the ions at a desired depth D within the intermediate structure 200. As known in the art, inevitably at least some ions may be implanted at depths other than the desired implantation depth, and a graph of the concentration of the ions as a function of depth into the intermediate structure 200 from the exposed surface of the layer of semiconductor material 210 may exhibit a generally bell-shaped (symmetric or asymmetric) curve having a maximum at the desired implantation depth.

Upon implantation into the intermediate structure 200, the ions may define an ion implant layer 212 within the intermediate structure 200. The ion implant layer 212 may comprise a layer or region within the intermediate structure 200 that is aligned with (e.g., centered about) the plane of maximum ion concentration within the intermediate structure 200. The ion implant layer 212 may define a zone of weakness within the intermediate structure 200 along which the intermediate structure 200 may be cleaved or fractured in a subsequent process, as described in further detail below.

In some embodiments of the present invention, the ion implant layer 212 may be disposed in one or both of the layers of semiconductor material 210 and the intermediate layer semiconductor material 206. In other words, the ion implant layer 212 may be disposed entirely within the layer of semiconductor material 210, as shown in FIG. 2A, or partially within the layer of semiconductor material 210 and partially within the intermediate layer of semiconductor material 206 (not shown). As one particular non-limiting example, in some embodiments, the ion implant layer 212 may extend into the layer of semiconductor material 210 a depth between about 100 nm and about 300 nm. In additional embodiments, the ion implant layer 212 may extend into the intermediate layer of semiconductor material 206.

Referring again to FIG. 2D, after attaching the bonding substrate 216 to the layer of semiconductor material 210 on a side thereof opposite the base substrate 202 to form the intermediate structure 230, as previously described with reference to FIG. 2C, the intermediate structure 230 may be subjected to further processes, e.g., a thermal treatment process to cause the intermediate structure 230 to cleave or fracture along the ion implant layer 212, thereby forming the intermediate structure 240 shown in FIG. 2D. In other words, the layer of semiconductor material 210 and, optionally, a portion 206' of the underlying intermediate layer of semiconductor material 206 may be delaminated from the remaining portion of the intermediate layer of semiconductor material 206 and the underlying base substrate 204 upon thermally treating the intermediate structure 230 (FIG. 2C).

Optionally, in some embodiments, a layer of dielectric material (not shown) may be formed over the layer of semiconductor material 210 after separating the layer of semiconductor material 210 and, optionally, the portion 206' of the underlying intermediate layer of semiconductor material 206. As previously described with respect to FIG. 2B, the layer of dielectric material may comprise, for example, silicon dioxide or silicon nitride, and may be formed by methods known in the art. The layer of dielectric material may be formed over the layer of semiconductor material 210 to achieve a high-quality, planar layer of semiconductor material 210 upon subsequent processes of the invention, i.e., post strain relaxation processes.

Figure 2E:
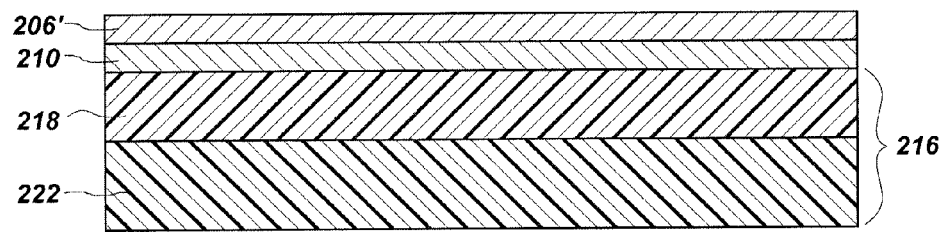

As shown in FIG. 2E, a mask material 223 may be formed and processed (e.g., patterned) over the layer of semiconductor material 210 and, optionally, in some embodiments, the intermediate layer of semiconductor material 206 or the layer of dielectric material 208 (FIG. 2B). The mask material 223 may be selected based on the desired etch depth and resistance with respect to underlying materials, such as the layer of semiconductor material 210, the compliant material 218 and, optionally, the intermediate layer of semiconductor material 206. As a non-limiting example, the mask material 223 may comprise a photoresist material or a hardmask material, such as an oxide material, a nitride material, or a metal material (i.e., chromium or titanium). A plurality of apertures 224, each exposing a surface of the layer of semiconductor material 210, may then be formed by patterning the mask material 223 using methods known in the art, thereby forming intermediate structure 250.

Figure 2F:
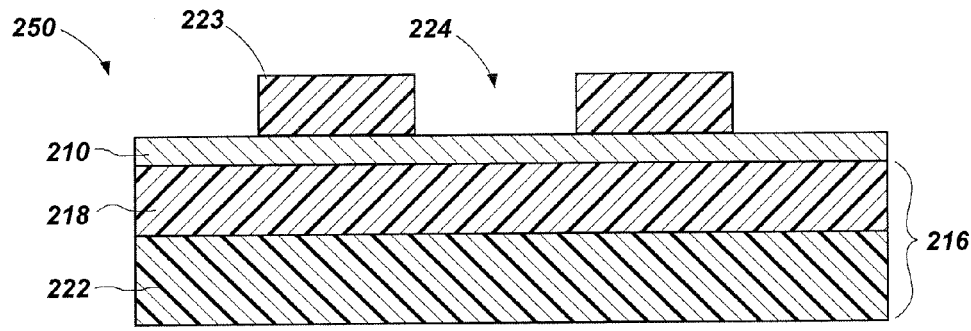

As shown in FIG. 2F, a portion of the layer of semiconductor material 210 and a remaining portion of the layer of compliant material 218' may be removed through the apertures 224 in the mask material 223 (FIG. 2E) using, for example, an anisotropic reactive ion (i.e., plasma) etching process, e.g., such as an inductively coupled plasma (ICP) etching process, or a isotropic etching process, e.g., such as a wet etching process, to form structures 226 protruding between openings 227. Each of the openings 227 may extend partially into the remaining portion of the layer of compliant material 218'. For example, each of the openings 227 may extend into the portion of the layer of compliant material 218' a distance that is from about 10% to about 95% of the thickness of the layer of compliant material 218'. As a non-limiting example, the layer of semiconductor material 210 may be indium gallium nitride, the remaining portion of the layer of compliant material 218' may be borophosphosilicate glass, the mask material 223 may be a photoresist, and a chlorine-containing plasma may be used to form the openings 227. After formation of the openings 227 extending through the structures 226 and, optionally, into the remaining portion of the layer of compliant material 218', the mask material 223 may be removed from the semiconductor structure 260.

Each of the structures 226 may comprise a portion of the layer of semiconductor material 210 and a portion of the layer of compliant material 218'. Each of the structures 226 may be formed to have a lateral dimension $X_1$ of between about 5 μm to about 1 mm, and may be spaced apart from adjacent structures 226 by a distance $d_1$ of between about 1 μm and 100 μm.

Figure 2G:
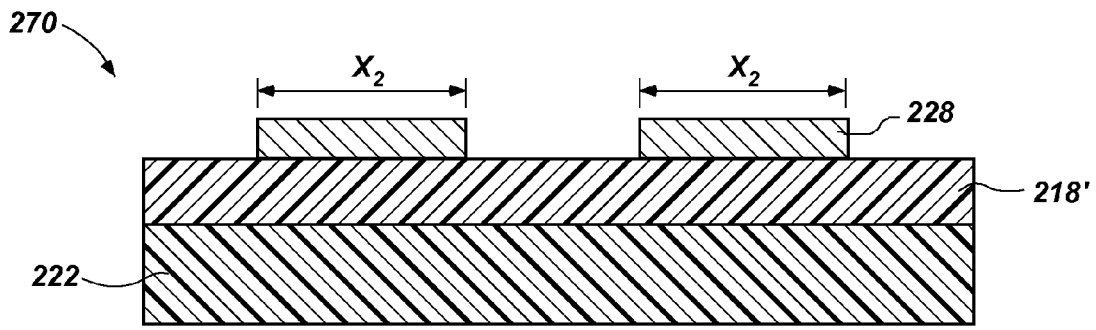

As shown in FIG. 2G, the viscosity of the remaining portion of the compliant material 218' may be altered to cause the relaxation of the structures 226, shown in FIG. 2F, forming relaxed (or partially relaxed) structures 228. By way of non-limiting example, the remaining portion of the compliant material 218' may be heated using, for example, an oven, furnace, or deposition reactor, to a temperature sufficient to decrease the viscosity thereof so that reflow begins to occur. A suitable temperature may be determined based on the composition of the portion of the compliant material 218' and the desired decrease in viscosity. In some embodiments, the portion of the compliant material 218' may be exposed to a temperature greater than or equal to a glass transition temperature ($T_g$) thereof, at which point the viscosity of the layer of compliant material 218' is decreased such that the portion of the compliant material 218' begins to reflow. As a non-limiting example, the portion of compliant material 218' may comprise borophosphosilicate glass (BPSG) and the semiconductor structure 270 may be heated to a temperature dependent on the percentage content of boron and phosphorous. By way of non-limiting example, where the portion of compliant material 218' is borophosphosilicate glass comprising 4% by weight boron and 4% by weight phosphorous, the semiconductor structure 270 may be exposed to a temperature of greater than about six hundred degrees Celsius (600° C.). Heating the semiconductor structure 270 to a temperature sufficient to reflow the portion of compliant material 218' relaxes or partially relaxes the overlying structures 226 of semiconductor material 210 (shown in FIG. 2F) to form relaxed (or partially relaxed) structures 228 having decreased lattice strain and may at least partially redistribute the portion of compliant material 218' to form a substantially planar layer.

Figure 2H:
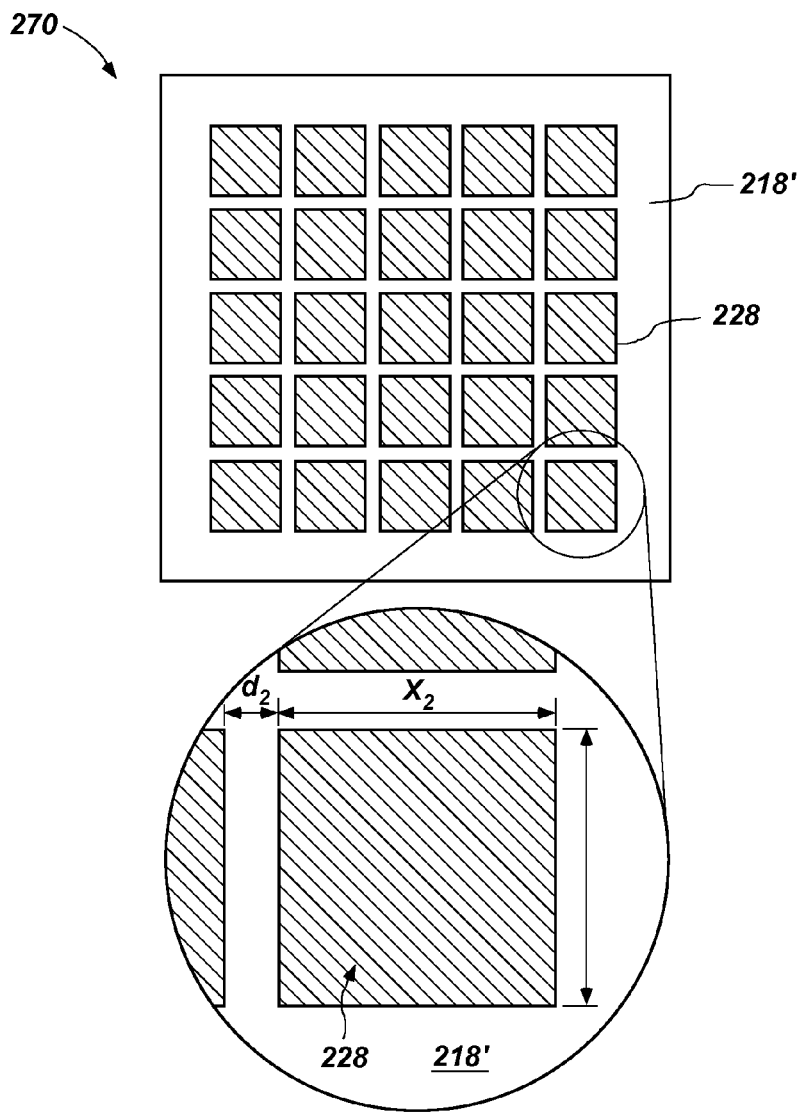
FIG. 2H is a plan view of the intermediate structure shown in FIG. 2G.

FIG. 2H is a top-down plan view of the semiconductor structure 270 shown in FIG. 2G. During reflow of the portion of compliant material 218', the relaxation process may progress from the peripheral regions to the center regions of the structures 228, which may result in expansion of relaxed (or partially relaxed) structures 228. Altering the viscosity of the portion of compliant material 218' may lead to reorganization of the atoms within the semiconductor material, forming a plurality of relaxed (or partially relaxed) structures 228 having a lateral dimension $X_2$ greater than a lateral dimension $X_1$ of the structures 226 of semiconductor material 210 (FIG. 2F). The relaxed (or partially relaxed) structures 228 may be separated from one another by a distance $d_2$ that may be less than the distance $d_1$ between the structures 226 prior to relaxation (FIG. 2F). The relaxed (or partially relaxed) structures 228 may exhibit substantially reduced or eliminated compressive or tensile lattice strain in comparison to the layer of semiconductor material 210 (FIG. 2A). As a non-limiting example, each of the relaxed (or partially relaxed) structures 228 may have a lateral dimension (i.e., a width or length) $X_2$ of between about 10 μm and about 1000 μm and may be spaced apart from adjacent relaxed (or partially relaxed) structures 228 by a distance $d_2$ of between about 0.5 μm and about 20 μm. The dimensions and spacing of the relaxed (or partially relaxed) structures 228 may be selected to correspond to the desired size of the semiconductor structure or device being fabricated. By way of non-limiting example, for fabrication of light-emitting diodes, the diode size (i.e., die size) may be about 1000 μm in width and 1000 μm in length. Similarly, dimensions of the structures 228 may be designed to correspond to the width and length of the desired cavity structure for laser diode fabrication.

Figure 3A:
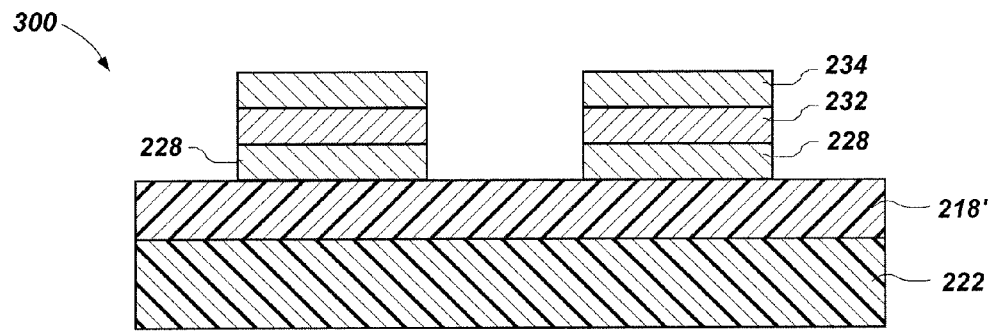
FIGS. 3A-3C are simplified cross-sectional views of an intermediate structure that may be formed during embodiments of methods of the present invention.

Another embodiment of a method that may be used to form semiconductor structures including relaxed (or partially relaxed) layers of semiconductor material is described with reference to FIGS. 3A-3C. Referring to FIG. 3A, a semiconductor structure 300 may be formed by forming another layer of semiconductor material 232 and a mask material 234 over the relaxed (or partially relaxed) structures 228 comprising a semiconductor material overlying the compliant material 218', such as that previously described with reference to FIG. 2G. In some embodiments, the another layer of semiconductor material 232 may be formed from materials selected to ineffectively deposit on the compliant material 218'. As a non-limiting example, the relaxed (or partially relaxed) islands 228 may include indium gallium nitride $In_{0.08}Ga_{0.92}N$ and the another layer of semiconductor material 232 may include indium gallium nitride $In_{0.13}Ga_{0.87}N$ and may be formed using a growth method such as, for example, metalorganic chemical vapor deposition (MOCVD), or metalorganic vapor phase epitaxy (MOVPE). For example, if the another layer of semiconductor material 232 is indium gallium nitride, the ineffective nucleation of III-nitride material on the compliant material 218' prevents growth of the indium gallium nitride material on the compliant material 218'. The mask material 234 may be formed and processed (e.g., patterned) over the another layer of semiconductor material 232. For example, the layer of semiconductor material may be selectively formed over the compliant material 218' and a photoresist may be patterning using conventional lithographic techniques, which are not described herein, and developed using a conventional wet developer which does not effect the compliant layer 218'. As another non-limiting example, the mask material 234 may include a metallic material or silicon nitride, which may be conformally deposited over the another layer of semiconductor material 232, and may be patterned and etched using conventional techniques, which are known in the art and are not described in detail herein.

Figure 3B:
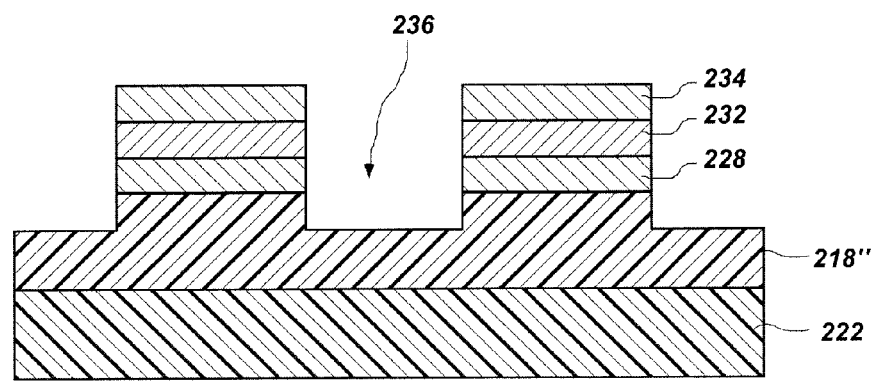

As shown in FIG. 3B, openings 236 extending at least partially into the remaining portion of the compliant material 218" may be formed by removing a portion of the compliant material 218', shown in FIG. 3A, with respect to the mask material 234 and, optionally, the relaxed (or partially relaxed) structures 228 and the another layer of semiconductor material 232. The openings 236 may be formed using a wet etching process or a dry etching process. For example, the compliant material 218" may include borophosphosilicate glass and a fluorine-containing plasma may be used to form openings 236 therein.

Figure 3C:
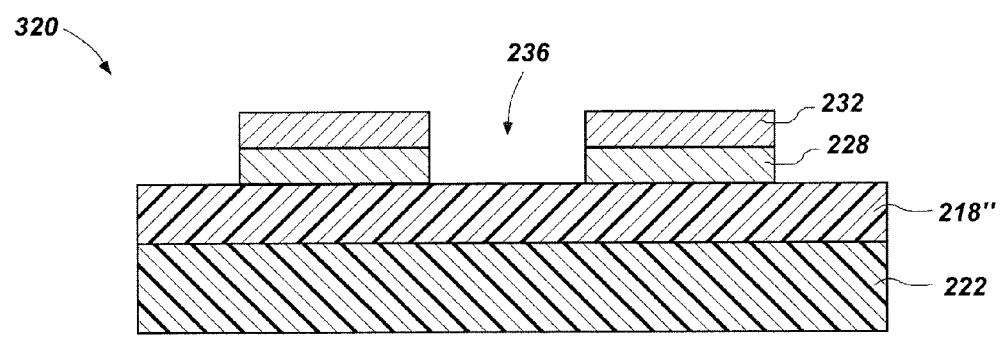

Referring to FIG. 3C, the viscosity of the layer of compliant material 218" may be decreased (i.e., reflowed) to cause the overlying relaxed (or partially relaxed) structures 228 and the another layer of semiconductor material 232 to relax to a degree. The viscosity of the compliant material 218" may be changed by exposing the semiconductor structure 320 to a sufficient temperature to cause the layer of compliant material 218 to reflow. For example, the compliant material 218" may be reflowed by heating to a temperature above a glass transition temperature ($T_g$) thereof, and may be maintained at this temperature until partial relaxation of the relaxed (or partially relaxed) structures 228 and the another layer of semiconductor material 232 is achieved. As a non-limiting example, the compliant material 218" may include borophosphosilicate glass and the semiconductor structure 320 may be heated to a temperature of greater than about 600° C. Where the relaxed (or partially relaxed) structure 228 includes indium gallium nitride $In_{0.08}Ga_{0.92}N$ and the another layer of semiconductor material 232 includes indium gallium nitride $In_{0.13}Ga_{0.87}N$, changing the viscosity of the compliant material 218" to cause reflow may relieve lattice strain. The method described with respect to FIGS. 3A-3C may be repeated multiple times in order to form semiconductor material layers having the desired composition. The compliant material 218" may be formed to have a thickness predetermined to facilitate removal thereof during repetition. By repeating the method described with reference to FIGS. 3A-3C a relaxed (or partially relaxed) indium gallium nitride layer having increased indium content may be formed.

Figure 4A:
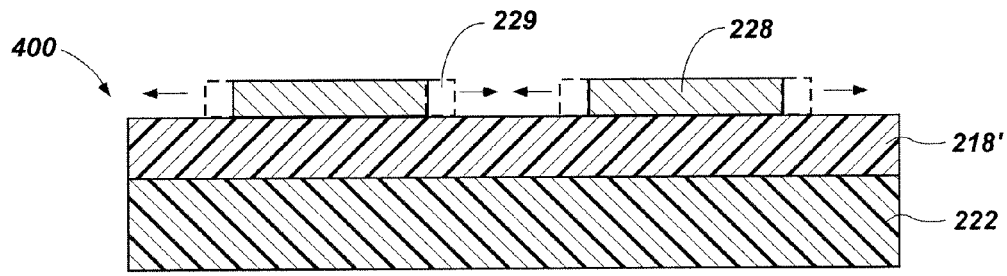
FIGS. 4A-4C are simplified cross-sectional views of an intermediate structure that may be formed during embodiments of methods of the present invention.

Another embodiment of a method that may be used to form semiconductor structures having relaxed (or partially relaxed) layers of a semiconductor material is described below with reference to FIGS. 4A-4D. Referring to FIG. 4A, a semiconductor structure 400 may be provided that includes the support substrate 222, the layer of compliant material 218', and relaxed (or partially relaxed) structures 228 such as described with respect to FIG. 2G. As a non-limiting example, each of the relaxed (or partially relaxed) islands 228 may include indium gallium nitride $In_{0.08}G_{0.92}N$, the layer of compliant material 218' may include borophosphosilicate, and the support substrate 222 may include sapphire.

Each of the relaxed (or partially relaxed) structures 228 may include a semiconductor material and may be laterally extended, as shown in broken lines, by growing the semiconductor material using a growth process, such as epitaxial layer overgrowth (ELO). For example, methods of performing lateral growth of a semiconductor material, such as a III-nitride material, are disclosed in the publications "Lateral Epitaxy of Low Defect Density GaN Layers Via Organometallic Vapor Phase Epitaxy" to Nam et al., Appl. Phys. Lett., vol. 71, No. 18, Nov. 3, 1997, pp. 2638-2640, and "Dislocation Density Reduction Via Lateral Epitaxy in Selectively Grown GaN Structures" to Zheleva et al., Appl. Phys. Lett., vol. 71, No. 17, Oct. 27, 1997, pp. 2472-2474, the disclosure of each of which is incorporated herein in its entirety by this reference. The general lateral growth of the relaxed (or partially relaxed) structures 228 is represented in FIG. 4A by directional arrows.

The lateral growth process may be performed at temperatures sufficient to alter the viscosity of the underlying compliant material 218', which may facilitate further relaxation of the semiconductor material in the relaxed (or partially relaxed) structures 228 as well as the laterally grown semiconductor material 229, which is shown in broken lines. By way of non-limiting example, the relaxed (or partially relaxed) structures 228 may include indium gallium nitride, which acts as a seed layer facilitating the lateral growth of indium gallium nitride. As the laterally grown semiconductor material 229 forms, it may adopt the lattice structure of the relaxed (or partially relaxed) structures 228.

Figure 4B:
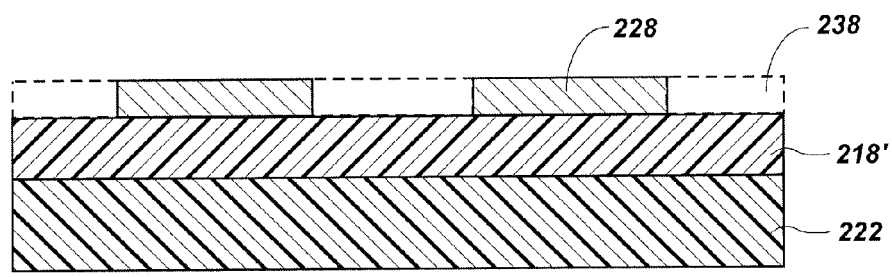
Figure 4C:
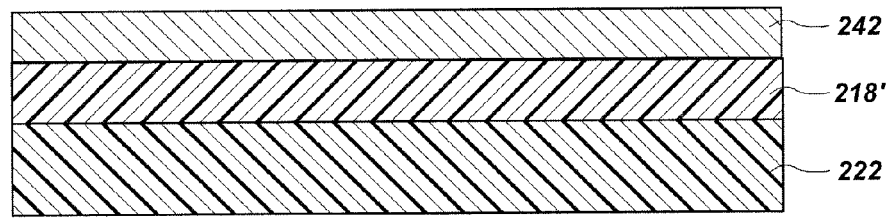

As shown in FIG. 4B, the laterally grown semiconductor material 229 of FIG. 4A may be grown until the relaxed (or partially relaxed) structures 228 coalesce to form a continuous layer of semiconductor material 238, which is shown in broken lines, after which the growth conditions may be altered so that the continuous layer of semiconductor material 238 may be vertically extended to a desired thickness to form a relaxed (or partially relaxed) layer of semiconductor material 242, as shown in FIG. 4C. In some embodiments, the relaxed layer (or partially relaxed) layer of semiconductor material 242 may be formed by vertically growing semiconductor material using a conventional process such as hydride vapor phase epitaxy (HVPE), metalorganic phase epitaxy (MOCVD), and molecular beam epitaxy (MBE), while the compliant material 218' is reflowed to further relax the relaxed (or partially relaxed) layer of semiconductor material 242. The relaxed (or partially relaxed) layer of semiconductor material 242 may be formed having a lattice structure the same as or substantially similar to the relaxed (or partially relaxed) structures 228 (shown in FIG. 4A).

Figure 5A:
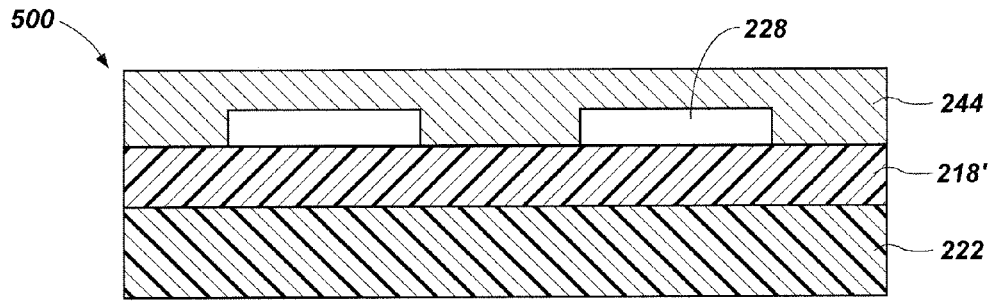
FIGS. 5A-5D are simplified cross-sectional views of an intermediate structure that may be formed during embodiments of methods of the present invention.

Another embodiment of a method that may be used to form semiconductor structures including relaxed (or partially relaxed) layers of semiconductor material is described with reference to FIGS. 5A-5D. Referring to FIG. 5A, a semiconductor structure 500 may be provided that includes relaxed (or partially relaxed) structures 228 disposed on a compliant material 218' overlying a support substrate 222, such as that previously described with reference to FIG. 2G. A layer of anti-surfactant material 244 may be formed over the compliant material 218' and the support material 222. As a non-limiting example, the relaxed (or partially relaxed) structures 228 may comprise a nitrogen-containing III-V type semiconductor material and the layer of anti-surfactant material 244 may include a material on which III-Nitrides poorly nucleate such as, for example, silicon dioxides and silicon nitrides or mixtures thereof.

Figure 5B:
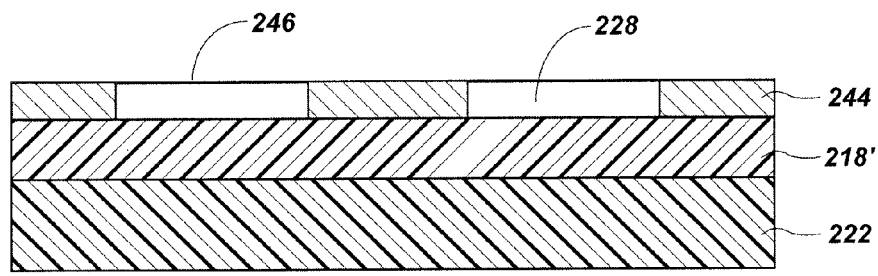

Referring to FIG. 5B, a portion of the layer of anti-surfactant material 244 may be removed using a reactive ion etching (RIE) process or a chemical-mechanical planarization (CMP) process to expose a surface 246 of the relaxed (or partially relaxed) structures 228 through the layer of anti-surfactant material 244.

Figure 5C:
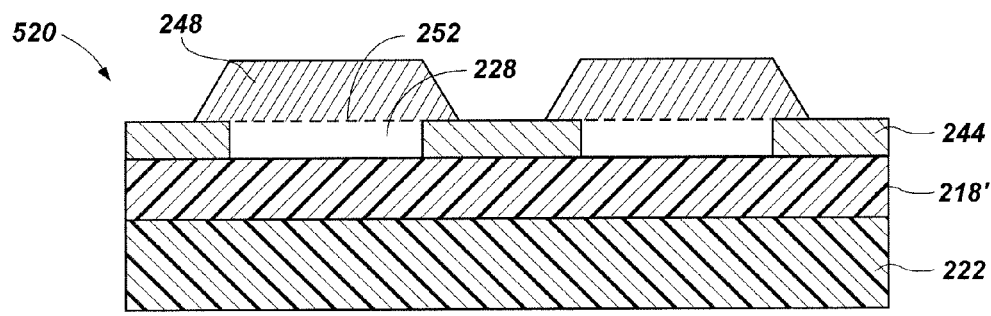
Figure 5D:
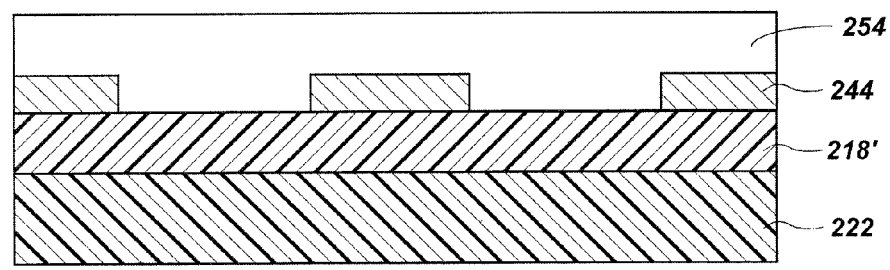

As shown in FIG. 5C, a semiconductor material 248 may be formed on the semiconductor structure 520 by a process such as epitaxial lateral over-growth (ELO) using surfaces 252 of the relaxed (or partially relaxed) structures 228, which are represented by broken lines, as a seed material. The semiconductor material 248 may adopt a lattice structure of the relaxed structures 228 and, thus, may be grown to form a relaxed layer of semiconductor material 254. The semiconductor material 248 may be grown to form a continuous layer having a desired thickness, such as shown in FIG. 5D.

For example, using embodiments of methods of the present invention described above, an engineered substrate (such as, for example, the intermediate structure 200 shown in FIG. 2A) may be formed to include an exposed seed layer of semiconductor material 206 comprising Ga-polar gallium nitride overlying a sapphire substrate. The seed layer of semiconductor material 206 may be used to grow an epitaxial layer of Ga-polar indium gallium nitride $In_{0.8}Ga_{0.92}N$ 210 thereon. The epitaxial layer of Ga-polar indium gallium nitride $In_{0.8}Ga_{0.92}N$ may be wafer-bonded to a borophosphosilicate glass layer overlying another sapphire substrate. A portion of the epitaxial layer of indium gallium nitride $In_{0.8}Ga_{0.92}N$ may be detached from the seed layer of semiconductor material 206 using a laser lift-off process so that epitaxial layer of N-polar indium gallium nitride $In_{0.8}Ga_{0.92}N$ remains on the another sapphire substrate. A mask material is applied and patterned to overlie regions of the epitaxial layer of N-polar indium gallium nitride $In_{0.8}Ga_{0.92}N$ where it is desired to form structures. A dry etching process (i.e., plasma etching process) may be performed to remove portions of the epitaxial layer of N-polar indium gallium nitride $In_{0.8}Ga_{0.92}N$ and the borophosphosilicate glass selective to the mask material. Remaining portions of the mask material may be removed after formation of the indium gallium nitride $In_{0.8}Ga_{0.92}N$ structures. The semiconductor structure may be thermally treated at a temperature sufficient to reflow the borophosphosilicate glass layer causing relaxation of the N-polar indium gallium nitride $In_{0.8}Ga_{0.92}N$ in the structures. Thereafter, an epitaxial layer overgrowth (ELO) process may be performed to laterally grow indium gallium nitride until a continuous layer of indium gallium nitride is formed to the desired thickness.

As another example, an engineered substrate (such as, for example, the intermediate structure 200 shown in FIG. 2A) may be formed to include an exposed seed layer of semiconductor material 206 comprising Ga-polar gallium nitride overlying a sapphire substrate. The seed layer of semiconductor material 206 may be attached to a second sapphire substrate using a conventional wafer-bonding process and may be removed using a conventional laser lift-off process so that the seed layer of semiconductor material 206 comprises N-polar gallium nitride. An epitaxial layer of N-polar indium gallium nitride $In_{0.8}Ga_{0.92}N$ may be formed over the seed layer of semiconductor material 206. A mask material may be formed and patterned over the epitaxial layer of N-polar indium gallium nitride $In_{0.8}Ga_{0.92}N$. A dry etching process (i.e., plasma etching process) may be performed to remove portions of the epitaxial layer of N-polar indium gallium nitride $In_{0.8}Ga_{0.92}N$ exposed through the mask material and the seed layer of semiconductor material 206 forming structures 226 comprising N-polar indium gallium nitride $In_{0.8}Ga_{0.92}N$. After formation of the structures 226, the remaining portions of the mask material may be removed and the semiconductor structure may be thermally treated at a temperature sufficient to reflow the borophosphosilicate glass layer causing relaxation of the N-polar indium gallium nitride $In_{0.8}Ga_{0.92}N$ in the structures. An epitaxial layer overgrowth (ELO) process may be performed to laterally grow the N-polar indium gallium nitride $In_{0.9}Ga_{0.1}N$ until a continuous layer of semiconductor material is formed, as described with respect to FIG. 4C. Ion implantation may be performed to a desired depth to define an ion implant layer, as described with respect to FIG. 2A. The implanted N-polar indium gallium nitride $In_{0.8}Ga_{0.92}N$ may be wafer-bonded to a third sapphire substrate and separated from the second sapphire substrate along a zone of weakness defined by the ion implant layer. The ion implantation process and removal process may be repeated to form a desired number of composite substrates, each having a desired thickness of N-polar indium gallium nitride $In_{0.8}Ga_{0.92}N$.

Although embodiments of the present invention have been primarily described herein with reference to layers of semiconductor material comprising indium gallium nitride, the present invention is not so limited, and embodiments of the present invention may be used to provide layers of semiconductor material comprising other III-nitride type materials, layers of other III-V type semiconductor materials, or layers of other semiconductor materials (such as, for example, layer of II-VI type semiconductor materials, layers of silicon, and layers of germanium).

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. An engineered substrate, comprising a layer of indium gallium nitride wafer bonded directly to a layer of borophosphosilicate glass overlying a substrate, a plurality of openings extending through the layer of indium gallium nitride and partially through the layer of borophosphosilicate glass, wherein the openings of the plurality of openings extend a distance into the layer of borophosphosilicate glass material that is from about 10% to about 95% of a thickness of the layer of borophosphosilicate glass material, and wherein the layer of indium gallium nitride exhibits a relaxed lattice structure and has an exposed surface on an opposing side thereof from the layer of borophosphosilicate glass.

2. The engineered substrate of claim 1, wherein the layer of indium gallium nitride comprises a plurality of structures overlying the layer of borophosphosilicate glass.

3. The engineered substrate of claim 1, wherein the layer of indium gallium nitride comprises a continuous layer of indium gallium nitride.

4. The engineered substrate of claim 1, further comprising a plurality of structures comprising an anti-surfactant material disposed on the layer of borophosphosilicate glass and underlying the layer of indium gallium nitride.

5. The engineered substrate of claim 1, wherein the layer of indium gallium nitride comprises an epitaxial layer of $In_{0.1}Ga_{0.9}N$.

6. An intermediate structure formed during fabrication of an engineered substrate, the intermediate structure comprising a plurality of openings extending through a layer of indium gallium nitride and partially though a layer of borophosphosilicate glass material overlying a base substrate, the openings of the plurality of openings extending a distance into the layer of borophosphosilicate glass material that is from about 10% to about 95% of a thickness of the layer of borophosphosilicate glass material, the layer of indium gallium nitride being wafer bonded directly to the glass material and having an exposed surface on an opposing side thereof from the glass material, the layer of glass material exhibiting a viscosity sufficient to provide redistribution thereof.

7. The intermediate structure of claim 6, further comprising a dielectric material disposed in each of the openings.

8. The intermediate structure of claim 6, wherein the layer of indium gallium nitride comprises a plurality of structures overlying the layer of borophosphosilicate glass.

9. The intermediate structure of claim 6, wherein the layer of indium gallium nitride comprises a continuous layer of indium gallium nitride.

10. The intermediate structure of claim 6, further comprising a plurality of structures comprising an anti-surfactant material disposed on the layer of borophosphosilicate glass and underlying the layer of indium gallium nitride.

11. The intermediate structure of claim 6, wherein the layer of indium gallium nitride comprises an epitaxial layer of $In_{0.1}Ga_{0.9}N$.

12. The intermediate structure of claim 6, wherein the borophosphosilicate glass includes at least about 4% by weight boron and at least about 4% by weight phosphorous.

13. The engineered substrate of claim 1, wherein the borophosphosilicate glass includes at least about 4% by weight boron and at least about 4% by weight phosphorous.

* * * * *